(12) United States Patent
Cowburn

(10) Patent No.: US 6,867,988 B2
(45) Date of Patent: Mar. 15, 2005

(54) MAGNETIC LOGIC ELEMENTS

(75) Inventor: Russell Paul Cowburn, Durham (GB)

(73) Assignee: Eastgate Investment Limited, Hamilton (BM)

(*) Notice: Subject to any disclaimer, the term of this patent is extended or adjusted under 35 U.S.C. 154(b) by 94 days.

(21) Appl. No.: 10/432,007

(22) PCT Filed: Nov. 19, 2001

(86) PCT No.: PCT/GB01/05072

§ 371 (c)(1),
(2), (4) Date: May 16, 2003

(87) PCT Pub. No.: WO02/41492

PCT Pub. Date: May 23, 2002

(65) Prior Publication Data

US 2004/0027899 A1 Feb. 12, 2004

(30) Foreign Application Priority Data

Nov. 17, 2000 (GB) .............................................. 0028092

(51) Int. Cl.$^7$ ............................................... G11C 19/08
(52) U.S. Cl. .............................. 365/41; 365/55; 257/24
(58) Field of Search ............................. 365/41, 55, 66, 365/74

(56) References Cited

U.S. PATENT DOCUMENTS 6,115,170 A * 9/2000 Puzey ......................... 359/278
6,774,391 B1 * 8/2004 Cowburn ..................... 257/24

OTHER PUBLICATIONS

R. P. Cowburn and M. E. Welland, "Room Temperature Magnetic Quantum Cellular Automata", SCIENCE magazine, vol. 287, Feb. 25, 2000, pp. 1466–1468 (3 pages).

Craig S. Lent, et al., "Quantum Cellular Automata", Nanotechnology 4 (1993), pp. 49–57 (9 pages).

Islamshah Arnlani, et al., "Digital Logic Gate Using Quantum–Dot Cellular Automata", SCIENCE magazine, vol. 284, Apr. 9, 1999, pp. 289–291 (3 pages).

W. H. Henkels, et al., "Josephson Soliton Logic and Read–Only Memory Circuits", IBM Technical Disclosure Bulletin, vol. 24 No. 7A, Dec. 1981, pp. 3237–3243 (7 pages).

* cited by examiner

Primary Examiner—Son T. Dinh
(74) Attorney, Agent, or Firm—McDonnell Boehnen Hulbert & Berghoff LLP

(57) ABSTRACT

A magnetic logic element for a logic device is described formed by at least one conduit capable of sustaining and propagating a magnetic soliton, the conduit being adapted by the provision of nodes and/or directional changes giving rise to discontinuities in soliton propagation energy as a result of which logical functions may be processed. Magnetic logic devices such as interconnects and gates, and magnetic logic circuits incorporating such devices and suitable operational fields, are also described.

26 Claims, 14 Drawing Sheets

MAGNETIC LOGIC ELEMENTS

RELATED APPLICATIONS

This application is a 35 U.S.C § 371 to PCT/GB01/05072, filed Nov. 19, 2001, which claims priority to Great Britain Application No. 0028092.5, filed Nov. 17, 2000.

BACKGROUND

1. Field of Invention

The invention relates to the provision of logic elements for logic devices and logic circuitry using the properties of magnetic quantum cellular automata, and in particular to an architecture for the design of such logic elements and devices and for the design and operation of logic circuitry using such elements.

2. Description of Related Art

The number of transistors on a microchip has doubled every 18 months for the past 30 years, a phenomenon known as 'Moore's Law'. Fundamental physical phenomena associated with small particles make this exponential growth increasingly difficult to sustain. One option already being considered by the semiconductor memory industry is to incorporate nanometre sized magnetic particles ('nanomagnets') into microelectronic devices. A computer system requires not only memory, however, but also the ability to process information, the latter usually being achieved through electronic logic devices.

A new device architecture has been proposed constructed from nanomagnets which could be used to perform logic functions magnetically (Cowburn and Welland, Science Vol 287 pp 1466–1468). These so-called magnetic quantum cellular automata (MQCA) devices offer potentially 40,000 times higher integration density than conventional microelectronics while only dissipating a fraction of the power.

The magnetic logic system described in the reference described arrays of magnetic nanodots and uses magnetic solitons to carry information. A magnetic soliton is simply a semi-abrupt and mobile transition from one magnetisation direction to another. There are two important parameters associated with any component of such a magnetic logic system: its soliton propagation field and its soliton nucleation field. The soliton propagation field is the strength of magnetic field which must be applied to move the soliton freely through the logic component. It is a measure of the resistance to motion which the soliton experiences and is analogous to (static) friction in mechanical systems. The soliton nucleation field is the strength of magnetic field which must be applied to create spontaneously a pair of solitons in a logic component. Such spontaneous creation is undesirable as it leads to an erroneous logic state being generated. Soliton nucleation is analogous to electrical break-down in electronic systems.

An ideal magnetic logic device would have a propagation field very close to zero (solitons propagate completely freely without any resistance to motion) and a very high nucleation field (errors are very difficult to create). The figure of merit for any real magnetic logic component is the field separation between the soliton propagation field and nucleation field: it must be possible to apply a magnetic field which is strong enough to propagate existing solitons without erroneously nucleating new ones. The larger the gap between the propagation and nucleation fields, the greater the distribution in manufacturing tolerances that the device can tolerate.

To generate practical logic devices it is necessary to develop a practical architecture for the interconnects and logic gates which are required to make up the device. In the Cowburn and Welland reference solitons are propagated along a track in the device by coupling between the adjacent discrete magnetic regions comprised by magnetic nanodots. Whilst the field necessary to propagate solitons in a straight line is relatively small, changes in direction, junctions, and logic gates will result in poorer coupling between adjacent solitons. The resulting energy discontinuity necessitates higher propagation fields, reducing the gap between the propagation and the nucleation fields, and leading to the problems above described. The discontinuities were exacerbated by the discontinuous structure of the MQCAs in the reference paper.

SUMMARY

The present invention seeks to provide an architecture for magnetic logic elements of a logic device which maximises the gap between the propagation and the nucleation fields to mitigate the above problems.

According to the present invention there is provided a magnetic logic element for a logic device comprising at least one conduit capable of sustaining and propagating a magnetic soliton, wherein the conduit is further adapted by the provision of nodes and/or directional changes as a result of which logical functions may be processed.

In accordance with the invention, a magnetic soliton is propagated along the conduit. The nodes and/or corners incorporated into the conduit structure will give rise to discontinuities in propagation energy, and these discontinuities can be exploited as the soliton is propagated to produce the logical functions desired.

For this to be possible, the magnetic conduit must be capable of both supporting the soliton and of allowing it to propagate. The magnetic properties of the conduit must be such that, and accordingly the conduit so configured that, this can take place. For effective functioning, it is therefore necessary for the soliton propagation field to be significantly less than any spontaneous soliton nucleation field. In particular, the soliton nucleation field should be at least twice and more preferably at least three times the soliton propagation field to produce an industrially viable device.

Whilst the consideration of soliton propagation alone does not place an upper limit on this ratio, it will be seen from the examples given below that there are circumstances where it is desirable, by application of a large field, to reset certain logic devices such as gates. For this function, the resetting field needs to exceed the soliton nucleation field. Accordingly, for such devices, it is preferable that the soliton nucleation field does not exceed ten times the soliton propagation field, and a preferred range is likely to be four to six times.

The incorporation of energy discontinuities in the form of nodes or corners within the conduit itself means that the logical functions are integral with the conduit structure, and that the magnetic logic element itself comprises, for example, a gate or an interconnect, with no need for a distinction between, for example, the semiconductor material of a device and the copper of a conduit which might be used in conventional systems.

The conduit effectively forms the device, in that it becomes the device merely through the changes in propagation energy which result at the nodes and branches. This represents a significant advance over the structure suggested in Cowburn and Welland. In that publication, the conduit had some functionality in relation to propagation of a magnetic soliton. In accordance with the present invention the changes in direction and nodes give further functionality in the form of specific logic functions integral to the conduit structure. Moreover, in contrast with the paper referred to, the present invention also makes the surprising and significant realisation that it is not necessary to create discrete magnetic regions of material (nanodots) to form the conduit in order to generate and sustain a soliton.

In accordance with the present invention, the magnetic conduit merely needs to have an architecture capable of sustaining and propagating a magnetic soliton. Such an architecture may comprise discrete magnetic regions, or semi-continuous magnetic regions, or a continuous track of magnetic material.

Thus the magnetic conduit may take the form of discrete areas of magnetic material, spaced in an array at a distance that is sufficiently small to ensure magnetic coupling between adjacent areas. For example, each array may comprise a chain of discrete dots of magnetic material, such as is described in the Cowburn and Welland reference, which dots may have a circular shape, an elliptical shape or a combination thereof. A soliton in this case is thus formed by the magnetic polarisation discontinuity between two adjacent areas. Such areas exploit magnetostatic coupling to facilitate propagation of the solitons.

Alternatively, the magnetic conduit may comprise magnetic areas which abut their neighbours, such as abutting geometric shapes such as hexagons etc. Alternatively, the magnetic conduit may be formed as a continuous track of magnetic material, effectively forming propagation zones for example by control of the domain structure. In these last two cases magnetic exchange coupling between functionally (but not materially) discrete regions facilitates propagation. The soliton is in effect the domain wall as it propagates along the track of magnetic material. Combinations of the foregoing may be employed.

For many applications, a continuous track is to be particularly preferred. Indeed, provided a continuous track architecture can be made suitable for the maintenance and propagation of solitons in accordance with the invention, it is likely to be preferred anyway from the point of ease of fabrication.

Such a track preferably has a width of less than 200 nm, more preferably less than 150 nm and most preferably less than 100 nm. The track width within any given magnetic logic element may be constant, or may be varied abruptly or gradually, for example to produce or to mitigate a discontinuity in propagation and energy within the magnetic logic elements.

The through thickness of the track is preferably between 5 and 20 nm, more preferably between 5 and 10 nm. Beaneath 5 mm, material inconsistencies and production difficulties are likely to be greater, above 10 nm power demands will rise. Again, the thickness may be constant throughout the length of the track in any given magnetic logic element or device, or may be varied abruptly or gradually to introduce or mitigate a discontinuity in propagation energy along the track.

In the alternative, the conduit may comprise an array of dots of magnetic material. Each dot has a width of 200 nanometers or less, preferably 100 nanometers or less.

The magnetic elements are preferably formed from a soft magnetic material such as permalloy (Ni80Fe20) or CoFe.

The magnetic material of the conduit may be formed on a substrate, for example of a material such as silicon.

References herein to an element of a logic device or to a logic device or to an element of a logic circuit, are intended to be read as extending to all circuit elements or devices which are known in the art as necessary to make up an effective logic-based system, in particular devices or circuit elements selected from the group comprising interconnects including straight interconnects, corners, branched interconnects and junctions, and logic gates such as AND, OR and NOT gates. Logic circuits manufactured therefrom include a plurality of elements selected from some or all of the foregoing in a suitable arrangement in the usual manner.

Reference herein to propagation energy is to the energy required to propagate a soliton through a magnetic conduit as above described. It will be appreciated that in a continuous track of constant configuration and thickness, or in a linear array of magnetic regions of identical properties, such as a linear array of magnetic nanodots of the same material, size, spacing and thickness, the propagation energy, being the energy necessary to produce effective magnetic coupling between the adjacent regions, will be generally constant. To produce effective interconnects and gates, deviation from strict linearity will be necessary through the provision of nodes, junctions and direction changes in the conduit, which will tend to produce less effective coupling along the track or between adjacent nanodots as the case may be and increase the energy required to propagate a soliton. Reference herein to a discontinuity in propagation energy is to a discontinuity necessarily arising from such non-linearity which is utilised in accordance with the present invention in logic interconnects and gates and the like.

Such discontinuities would be expected to result in significant energy barriers to the propagation of a soliton across the discontinuity. Propagation energies would necessarily rise significantly, resulting in a smaller gap between propagation and nucleation energies. In extreme cases there might be a tendency for stray nucleation events to occur, and to therefore produce magnetic breakdown in the logic device.

If necessary this can be addressed in one embodiment of the invention in that a transition zone is provided. In this embodiment the conduit includes at least one discontinuity in propagation energy therealong, at a direction change or node, and a transition zone is provided in advance of the discontinuity in a propagation direction, wherein magnetic properties in the transition zone are adapted to provide a gradual propagation energy transition to the discontinuity.

In this embodiment, the effect of the discontinuity is much minimised by provision of a transition zone in advance of the discontinuity, at least in the desired propagation direction, which decreases the gradient of the energy mismatch between any two adjacent magnetic regions by spreading the energy mismatch over several such regions. This exploits the realisation that the propagation energy in the working device need only be raised sufficiently to give sufficient energy to propagate the soliton along the conduit over the energy barrier between any two adjacent regions. The use of a transition zone reduces the maximum energy mismatch at any given point in the approach to the discontinuity and thus reduces the propagation energy, maintaining a large effective gap between propagation and nucleation energy and minimising the likelihood of undesired nucleation events.

The skilled person will readily appreciate those non-linear scenarios in which reduced effective coupling and consequent increases in propagation energy are likely to arise. These will include direction changes, cross-overs and fan-outs in interconnects, and junctions and other functional regions in logic gates. If the discontinuities at these points are so great relative to the difference between soliton propagation and soliton nucleation energy may lead to erroneous nucleation events, then the provision of a transition zone might be desirable. In practice, this is found to rise in particular in relation to conduits comprising arrays of discrete magnetic nanodots. However, in the majority of instances, and in particular where continuous tracks are employed, provided the difference between propagation and nucleation energy is kept sufficiently high, it has been found that a transition zone before the discontinuity in propagation energy formed by the node or corner will not be necessary, since the propagation field itself will be sufficient to propagate the soliton across the discontinuity without running the risk of stray nucleation events.

If a transition zone is provided it may be adapted to provide a gradual energy transition by variation of underlying magnetic material properties or by variation of features of shape and configuration of the magnetic material between along the conduit. For simplicity, this latter alternative is much preferred.

In such a transition zone in advance of the discontinuity, a number of alternatives may be used separately or in combination to produce the gradual variation in propagation energy. In the case of discrete magnetic areas, such as nanodots, variations in spacing, size and thickness in a direction perpendicular to a propagation plane may be employed. Preferably, adjacent magnetic regions in the transition zone provide a gradual energy transition in advance of the discontinuity by means of a gradual variation in thickness in a direction perpendicular to the propagation plane. Increases in thickness increase the energy of the soliton. Where partially-overlapping magnetic areas are employed, variations in any of the foregoing or in degree of overlap may be contemplated. Where continuous magnetic tracks are employed, the thickness of the track may be varied in a direction perpendicular to the plane of propagation, or track width may be varied. In this case, preferably adjacent regions in a transition zone are adapted to provide a gradual energy transition by gradual variation in track width. Wider tracks will impart higher energies.

The extent of the transition region is a trade off between the desire to keep transitional lengths small to maximise device density, and the desire to avoid excess propagation field discontinuities. Preferably, variation in energy between adjacent regions is of the order 5 to 20%, preferably substantially around 10%. Where variation is achieved by varying thickness of the magnetic material in a direction perpendicular to the plane of propagation, thickness of adjacent regions preferably vary by between 5 to 20%, more preferably substantially around 10%. Similarly, where variation is achieved by variation of the width of a continuous track, widths applicable to adjacent magnetic regions preferably vary by between 5 and 20%, more preferably substantially 10%.

In certain embodiments, the magnetic logic element includes one or more discrete magnetic regions having anisotropic magnetic properties in the propagation plane. As will be seen in the following detailed description, this might be desirable in a number of circumstances to enhance coupling between adjacent regions. Anisotropy is preferably introduced by control of shape and configuration at the magnetic region in question. In the embodiment where the array of magnetic regions comprises a chain of dots, the said anisotropic property is achieved in that the dot is elliptical. Anisotropy fields of the order of 50 to 200 Oe will be suitable for most purposes.

According to a further aspect of the invention, a magnetic logic interconnect for a magnetic logic circuit comprises at least one element as above described. According to a further aspect of the invention, a magnetic logic gate for a magnetic logic circuit comprises at least one element as above described. According to a further aspect of the invention, a magnetic logic circuit comprises a plurality of suitably designed magnetic logic interconnects and magnetic logic gates as above described.

According to a further aspect of the invention, a magnetic logic device is provided comprising magnetic logic elements as above described and further comprising means for providing a controlled driving magnetic field. Any suitable field may be envisaged. Preferably, the means provides a controlled magnetic field consisting of two orthogonal fields operating in a predetermined sequence, preferable alternating, and more preferably forming a clocking field in a clockwise or anti-clockwise direction. In such a device, magnetic logic elements in accordance with the first aspect of the invention may be arranged to provide OR gates, AND gates, NOT gates, any suitable combination thereof, or any other known logic gates, together with suitable interconnects.

The device may further comprise suitable electrical input and/or outputs to enable the magnetic logic device to be used in a larger circuit.

An example of the operation of a magnetic logic device logic device in accordance with the principles of the invention will now be described. This will be used to illustrate the development of example architectures for elements of the device, such as interconnects and logic gates, in accordance with the principles of the invention, as shown in FIGS. 2 to 15 where in each case examples are given for both nanodot and continuous track architectures (figures subreferred to repectively as a and b).

BRIEF DESCRIPTION OF THE DRAWINGS

Reference is made to FIGS. 1 to 16 of the accompanying drawings by way of such illustration, in which.

DETAILED DESCRIPTION OF EXEMPLARY EMBODIMENTS

An example mode of operation is first described and is then used to develop example architectures for practical logic devices in accordance with the invention.

(i) Clocking

Figure 1:
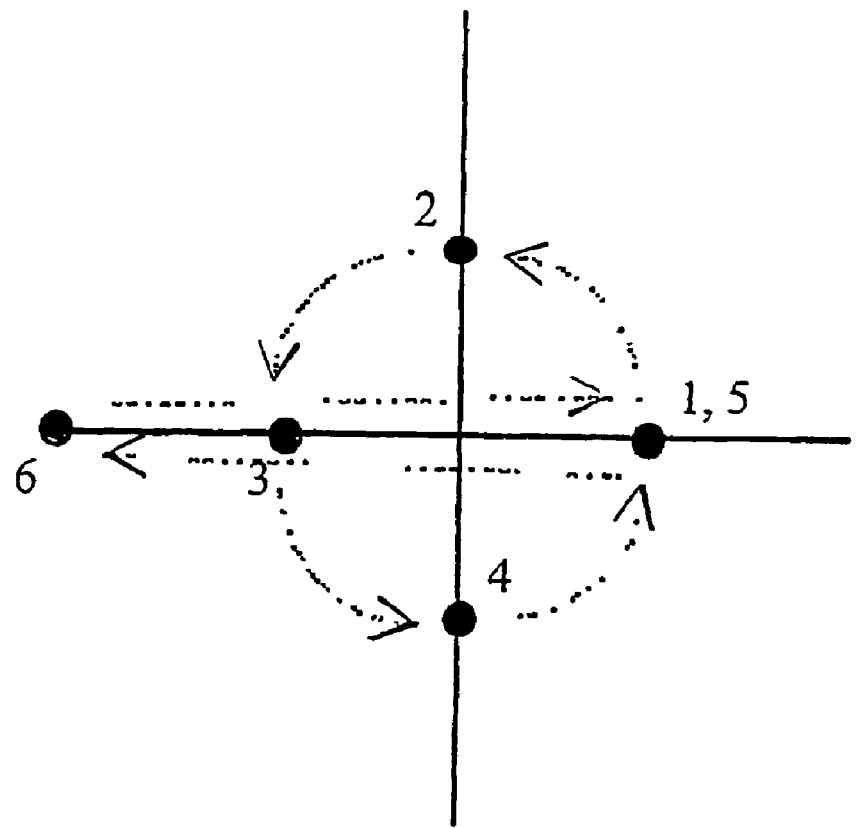
FIG. 1 shows a polar plot showing the locus of the magnetic clock field vector during one clock period of a clocking field suitable for operating a device in accordance with the invention.

According to the example mode of operation used to develop the example architectures hereinafter, a magnetic field is applied to the logic device which acts both as power supply and as clock. The clock has six different phases per period; FIG. 1 shows these schematically.

In FIG. 1 is illustrated a polar plot showing the locus of the magnetic clock field vector during one clock period. The field vector begins the period pointing to the right at phase 1. It then proceeds to rotate anti-clockwise through phases 2, 3, and 4 and then back to where it started at phase 5. These 5 phases all have constant magnitude. In phase 6 it jumps to a large left-pointing value before returning to phase 1.

The phases can be applied either as a continuous rotation of the magnetic field or as discrete jumps from one direction to the next. The first four phases constitute a 360° rotation of the applied field and serve to propagate solitons around the logic network. The $5^{th}$ and $6^{th}$ phases introduce a higher magnitude field pulse which is used to clear logic gates to their default condition. It can be seen from FIG. 1 that the clock has a definite sense of rotation. For the sequence of directions shown in FIG. 1 this sense is anti-clockwise, although a logic system with a clockwise field sense would work just as well. Section (ii) will show that the clock sense is very important in the design of signal routing blocks and logic gates.

(ii) Architecture Design Process

Figure 16:
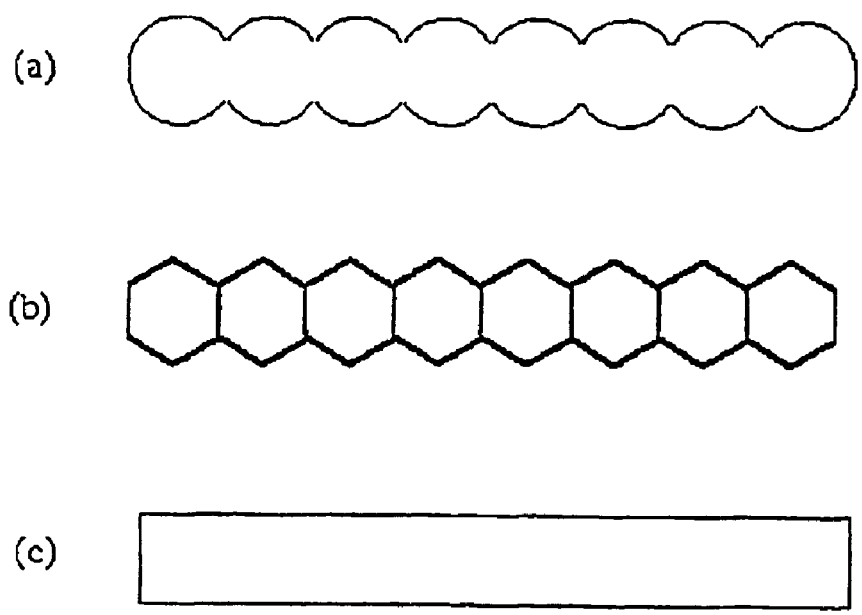
FIG. 16 shows examples of exchange coupled magnetic logic element other than nanodots.

In the illustrated embodiments, the invention is applied to discrete magnetic regions comprising discreet magnetic nanodots of the type described in Cowburn and Welland, and to continuous tracks, but as has been noted the invention is applicable to any means of providing a conduit able to sustain propagating solitons, whether discreet dots or partially overlapping dots or continuous tracks where functionally discrete regions are otherwise provided, for example by domain control and the domain wall is in effect the soliton—in this regard see also FIGS. 16 and 17. There are three parameters for each dot which can be varied in the design of an architectural block: the position of the dot, its thickness and its (uniaxial) anisotropy. For continuous tracks variation in track width have equivalent effect to variation in thickness, and may be preferred.

Anisotropy can be varied in a real device comprising discrete magnetic nanodots by introducing a small degree of ellipticity to the nominally circular dot: the direction of the major axis of the ellipse gives the direction of the anisotropy easy axis (shown as a double headed arrow in this document) and the ratio of the lengths of major to minor axes gives the strength of the anisotropy (expressed as an anisotropy field, $H_u$, in this document). An ellipticity ratio of the order of 10% will be sufficient to generate anisotropy fields in the range of 100 Oe.

Numerical Monte Carlo calculations have been performed to simulate the propagation and nucleation of solitons at room temperature in each of the nanodot examples of architectural blocks described in the next two sections. These calculations have then been used to semi-optimise the positions, thickness and anisotropies of the dots shown for each block so as to minimise the propagation field and to maximise the nucleation field. Table 1 summarises the results from the calculations of propagation and nucleation fields for each architectural blocks presented in sections (iv) and (v) assuming that the dots are made from Permalloy ($Ni_{80}Fe_{20}$). Other magnetic materials such as Fe, Co or Ni may also be used. It will be noticed that most blocks exhibit propagation fields of <20 Oe and nucleation fields of >80 Oe. There is thus a wide window in between these two limits in which the clock field magnitude may be set.

In the specific examples of device elements which follow, anisotropy and thickness values are shown for each architectural block assuming a nominal dot size of 100 nm diameter and 10 nm thickness, placed on a mesh of pitch 135 nm. Specific implementations of this invention may use different nominal thicknesses, diameters and spacings in which case the anisotropy and thickness values given in the following two sections would need to be recalculated.

(iii) Logic Basis

The standard Boolean logic basis of '1' and '0' is used to describe the architecture of the examples presented in the present application. There are two possible mappings between the magnetisation direction of a given dot and the logic basis. We call the first 'absolute direction mapping' and the second 'relative flow mapping'.

Figure 2A:
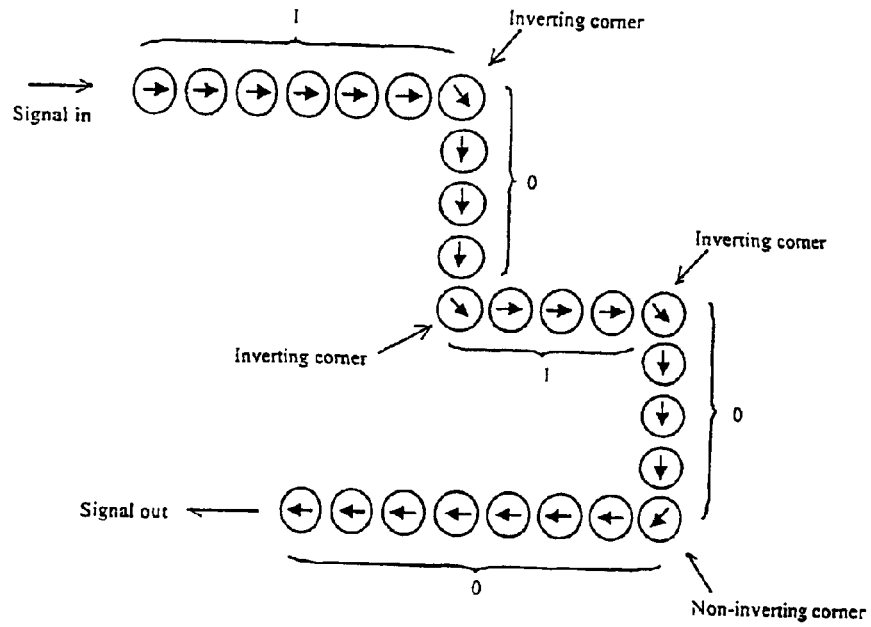
FIG. 2 shows the Boolean logic states for the different sections of a conduit according to the principles of absolute direction mapping.
Figure 2B:
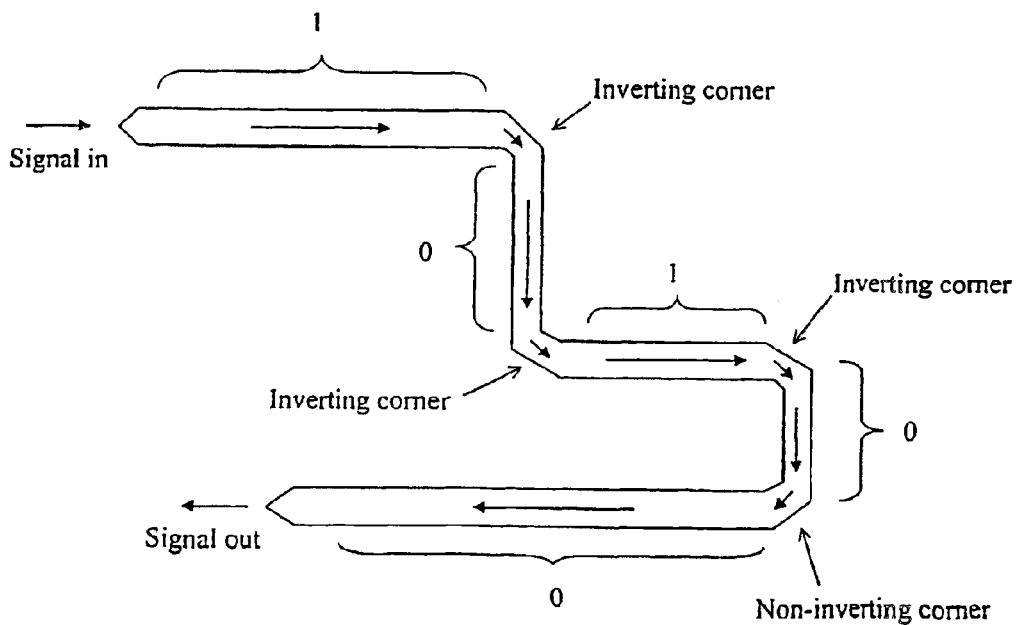

In absolute direction mapping, which is illustrated in FIG. 2, it is the absolute direction of the magnetisation which determines the logic state. Horizontal chains or track portions magnetised to the right are always logic '1' and horizontal chains or track portions magnetised to the left are always logic '0'. Similarly, vertical chains or track portions magnetised up the page are always logic '1' and vertical chains or track portions magnetised down the page are always logic '0'. The advantage of this system is that it is very simple to interpret a given spin direction in terms Boolean logic states. The disadvantage is that two of the four possible interconnect corners also invert the signal (see FIG. 2).

Figure 3A:
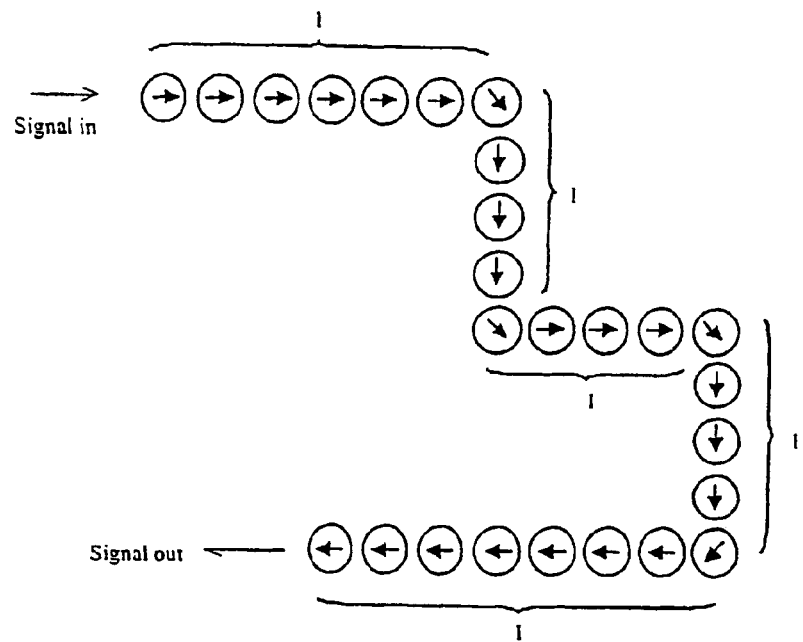
FIG. 3 shows a conduit following the principles of relative flow mapping in which the Boolean logic state is constant at all points in the conduit.
Figure 3B:
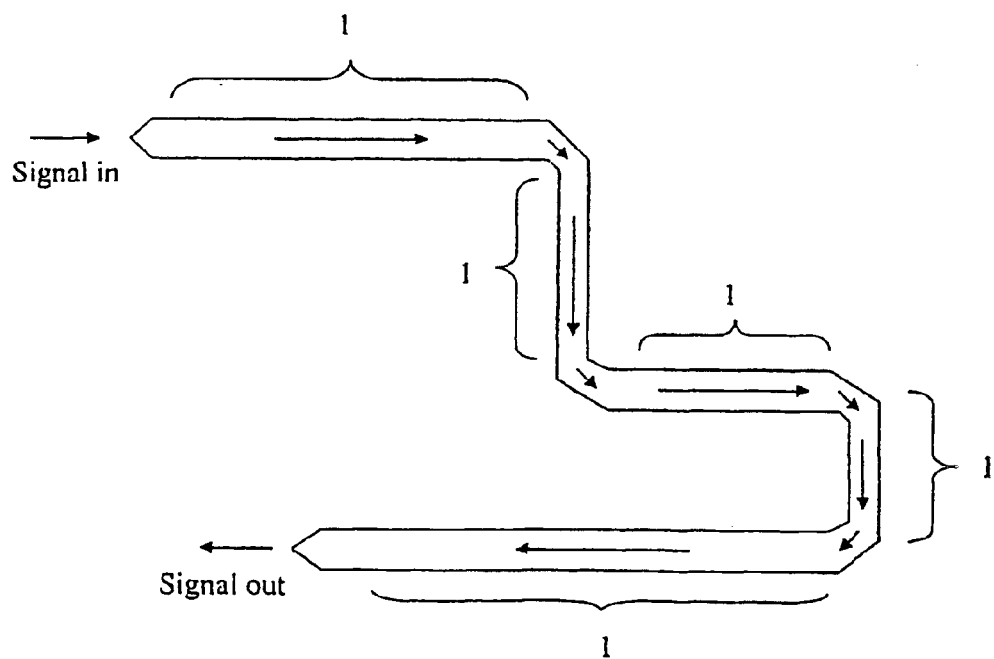

In relative flow mapping (FIG. 3), it is the relationship between the magnetisation direction and the signal flow direction which determines the logic state. If the magnetisation is aligned with the signal flow direction, then a Boolean '1' results. If the magnetisation opposes the signal flow direction, then a Boolean '0' results. The advantage of this system is that logic states are always preserved when turning corners (unless a NOT function is explicitly required at the corner—see below). It is therefore very simple to connect different logic blocks together. The disadvantage of relative flow mapping is that a little thought has to be given to interpreting a given spin direction in terms of Boolean logic states; the signal flow direction must also be taken into account.

The architecture developed for the examples described hereinafter assumes relative flow mapping. To change to absolute direction mapping does not change the physical behaviour of a logic system, but simply the nomenclature used to describe the logic elements.

(iv) Signal Routing (a) Straight Interconnect

Figure 4:
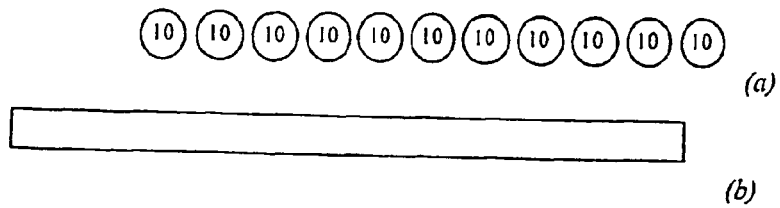
FIG. 4 shows a conduit used for carrying solitons in a straight line.

The simplest form of signal routing is through a straight line conduit, as shown in FIG. 4. The symmetric nature of the chain or track means that solitons propagate equally well both from left to right and from right to left.

(b) Unidirectional Interconnect

Figure 5:
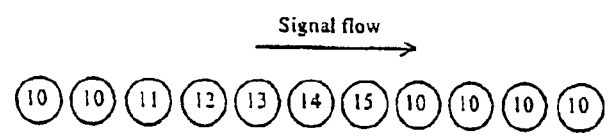
FIG. 5 shows a unidirectional interconnect (upper and lower) with a schematic graph of the soliton energy as it passes through the interconnect (centre)
Figure 5:
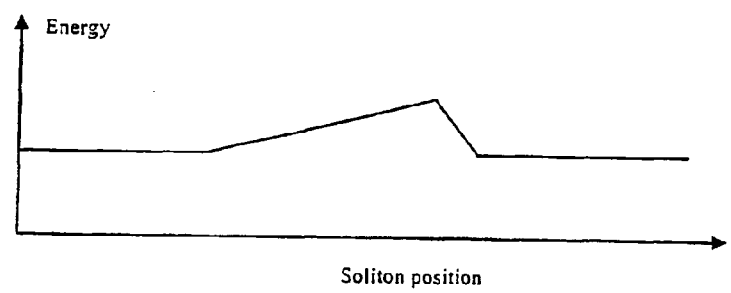

Unless wired-OR logic is being implemented, a given length of interconnect should only ever have signals flowing one way through it. An architectural interconnect block which only allows solitons to pass in one direction is useful for ensuring correct signal routing. FIG. 5 shows the basic principle in unidirectional signal routing in magnetic logic, according to this invention.

In FIG. 5a a thickness gradient is imposed on a nanodot based architecture, typically at a rate of 1 nm per dot. There is then an abrupt relaxation back to the nominal thickness. As the thickness of the dots increase, so does the energy of the soliton. In FIG. 5b a width gradient is imposed on a continuous track based architecture. The track has constant thickness but the width varies with distance to produce an equivalent effect. There is then an abrupt relaxation back to the nominal width. As the width increases, so does the energy of the soliton.

This results in an increased propagation field, as is illustrated in FIG. 5 centre. But the propagation field is analogous to force and depends upon the energy gradient. The propagation field for left to right propagation is still relatively low because of the gentle gradient. The propagation field for right to left, however, is high because of the steep gradient associated with the abrupt thickness transition. The interconnect thus behaves like a diode. A further, more useful feature of unidirectional interconnect is that it can be used to increase the potential energy of a soliton without introducing a substantial increase in propagation field. This is necessary in architectural blocks such as fan-out (below) where energy must be put into the system to form a second soliton, or in blocks such as the cross-road (below) where weak coupling at some point in the block must be compensated by thicker dots or thicker/wider tracks. A thickness or width gradient is also used in the asymmetric corner (below) where unidirectionality is used to prevent soliton reflection.

(c) Terminated Line

Figure 6:
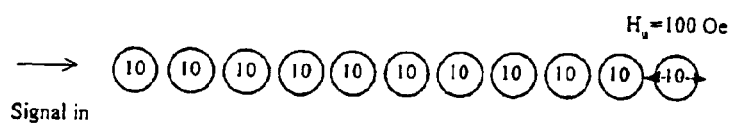
FIG. 6 shows a correctly terminated conduit.
Figure 6:
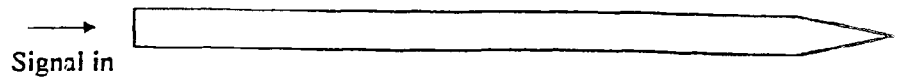

When a conduit terminates, the region in the vicinity of the termination experiences a different magnetic coupling environment. In the case of a chain of dots, the end dot only has one nearest neighbour and therefore only experiences half the inter-dot coupling of other dots. This makes it susceptible to soliton nucleation, which lowers the nucleation field of the entire chain. It is therefore important to terminate correctly loose ends of chains of dots. The simplest way to do so, according to this invention, is to introduce anisotropy to the end dot as illustrated in FIG. 6a. With a continuous line a different architecture is possible, and at the termination the line tapers to a needle point, as illustrated in FIG. 6b.

(d) Symmetric Corner

Figure 7A:
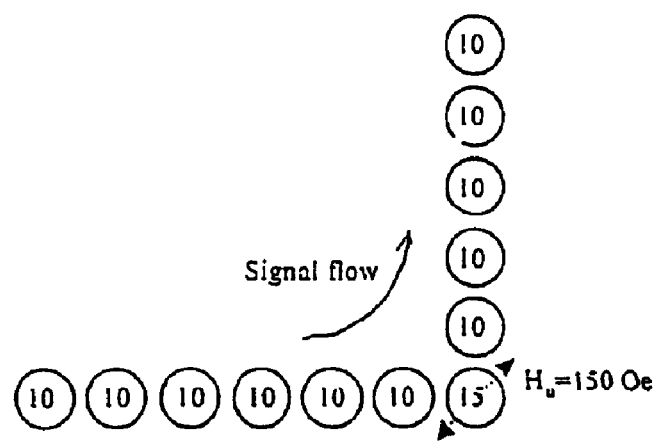
FIG. 7 shows a symmetric corner.
Figure 7B:
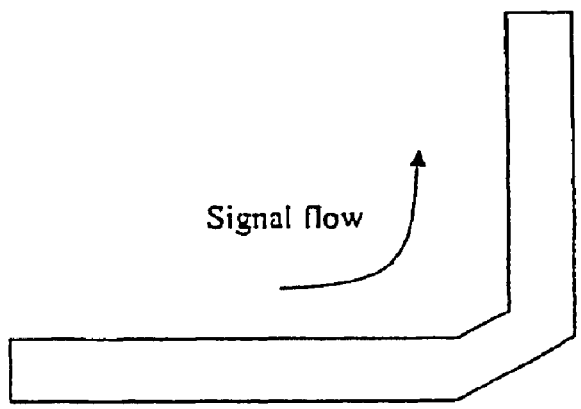

FIG. 7 shows the simplest way in which a signal can be made to turn a corner. A soliton enters the horizontal chain or track from the left and is carried to the corner during either phase 1 or 3 of the clock and then immediately up the vertical arm on the next clock phase. The uniaxial anisotropy on the corner dot or configuration of the track portion at the corner helps carry the magnetic flux around the corner.

The dot thicknesses or track widths are symmetric about the centre of the corner and so signals flow equally well in either direction. This can cause a problem if the sense in which a soliton navigates the corner (i.e. clockwise or anti-clockwise) is different from the sense of rotation of the clock field. If the two senses are the same, then no problem occurs and the signal is swept around the corner. If the senses are different, however, then the soliton will be reflected at the corner and unable to propagate. A given magnetic logic system will usually have a single sense of clock field rotation. This means in practice that the symmetric corner can only be used for those corners which are of the same sense as the clock. When it is desired to turn a corner in the opposite sense, the asymmetric corner (below) should be used.

(e) Asymmetric Corner

Figure 8A:
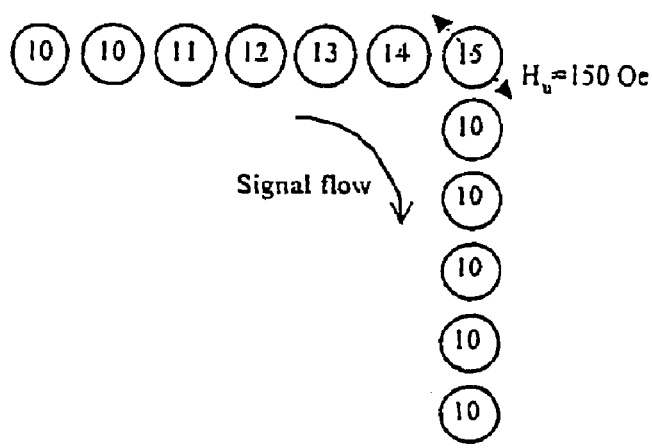
FIG. 8 shows an asymmetric corner.
Figure 8B:
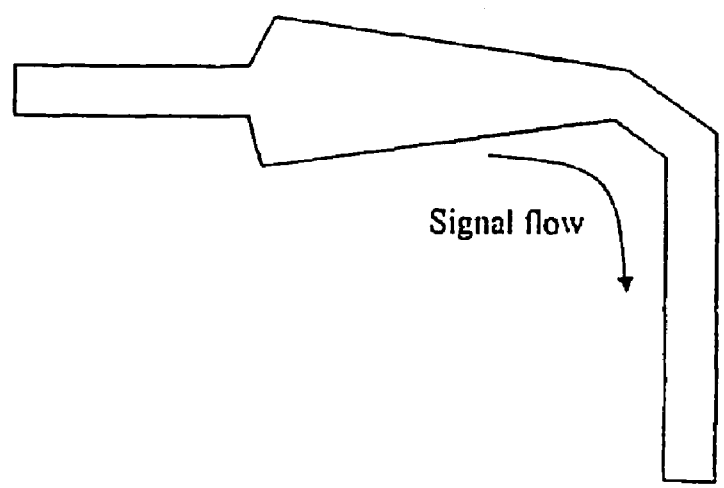

The asymmetric corner is shown in FIG. 8 and is used when a soliton must flow in the opposite sense to the sense of rotation of the clock field. A soliton enters the horizontal conduit from the left and is carried to the corner during either phase 1 or 3 of the clock. It then waits 5 phases and is carried down the vertical arm during the next clock period. Dot thickness (FIG. 8a) or track width (FIG. 8b) is varied on the approach to the corner. The thickness or width gradient on the incoming arm prevents the soliton from being reflected during its 5 phase wait. The uniaxial anisotropy on the corner dot (FIG. 8a) helps carry the magnetic flux around the corner. Signals flow around the asymmetric corner in the opposite sense to the sense of the clock.

(f) 2-phase Fan-out

Figure 9A:
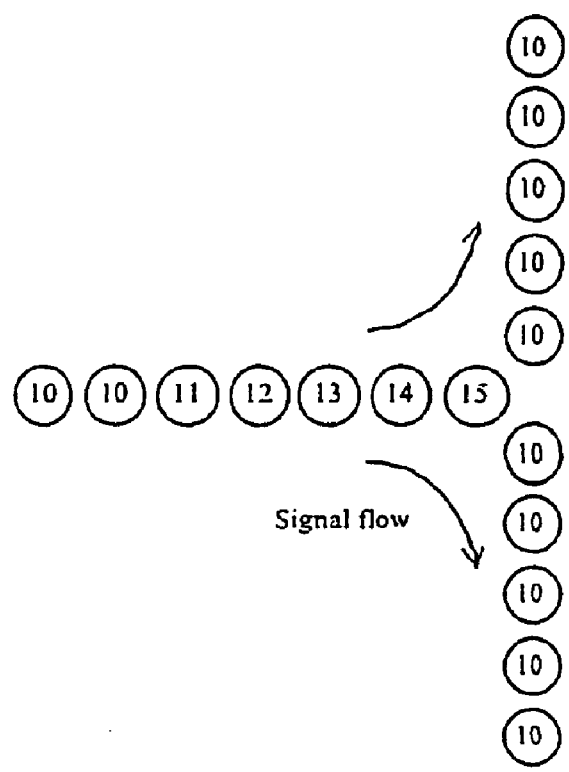
FIG. 9 shows a two-phase fan-out allowing a signal to split to two signals of opposite phase.
Figure 9B:
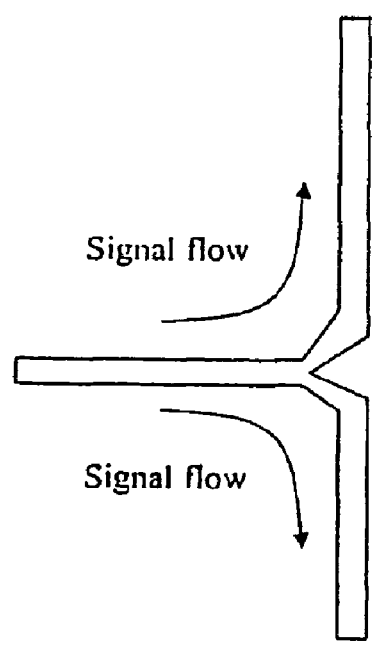

It is frequently necessary to split a signal into two identical signals, a process known as 'fan-out'. In magnetic logic, this means creating two solitons where previously only one existed. Two methods are described for doing this. The first is the 2-phase fan-out and is shown in FIG. 9. A single soliton enters to the right along the horizontal arm. On the next clock phase a soliton leaves through the upward vertical arm (if the clock rotation sense is anticlockwise; if it is clockwise then the first soliton leaves through the downward vertical arm). Nothing happens during the third phase and on the fourth phase a second soliton leaves through the other vertical arm. In FIG. 9a a thickness gradient is provided on the incoming arm before the fan out. In FIG. 9b a width gradient is provided on each outgoing arm beyond the fan out for equivalent reasons.

(g) 1-phase Fan-out

Figure 10A:
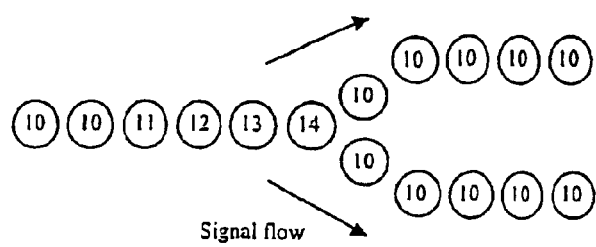
FIG. 10 shows a one-phase fan-out allowing a signal to split to two signals of same phase.
Figure 10B:
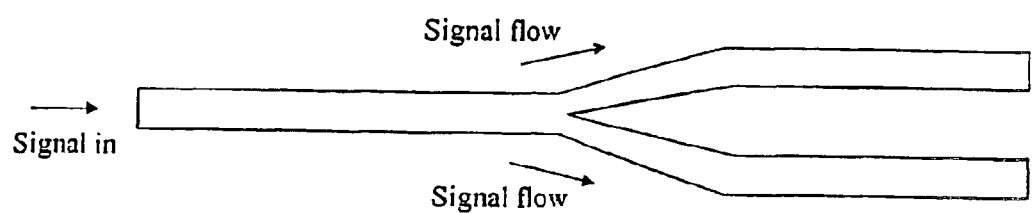

If it is desired to have the two fanned-out solitons travelling in the same direction as the original soliton, then the 1-phase fan-out should be used (FIG. 10). The incoming soliton is immediately split into two channels and continues propagating during the same clock phase. In FIG. 10a a thickness gradient is provided on the incoming arm before the fan out. In FIG. 10b a width gradient is provided on each outgoing arm beyond the fan out for equivalent reasons.

(h) Cross-road

Figure 11A:
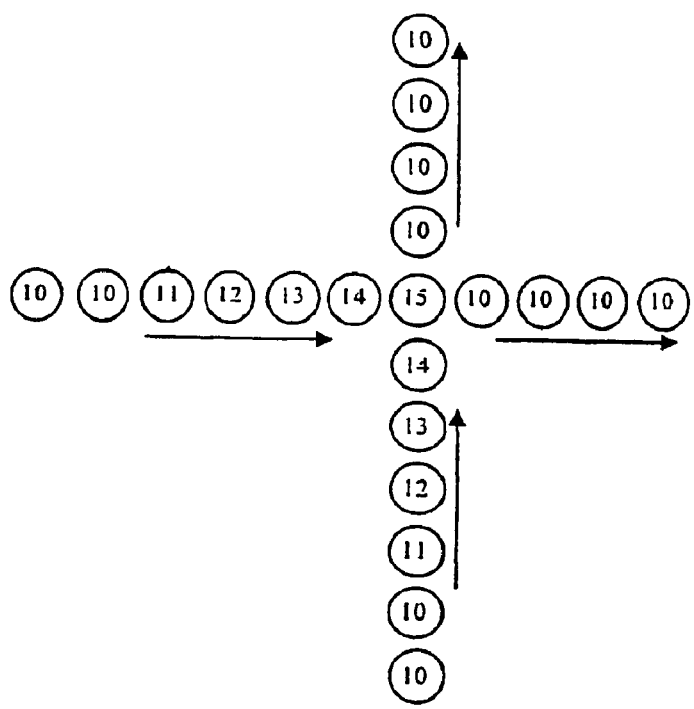
FIG. 11 shows a cross-road, allowing two signal lines to cross each other in the same plane.
Figure 11B:
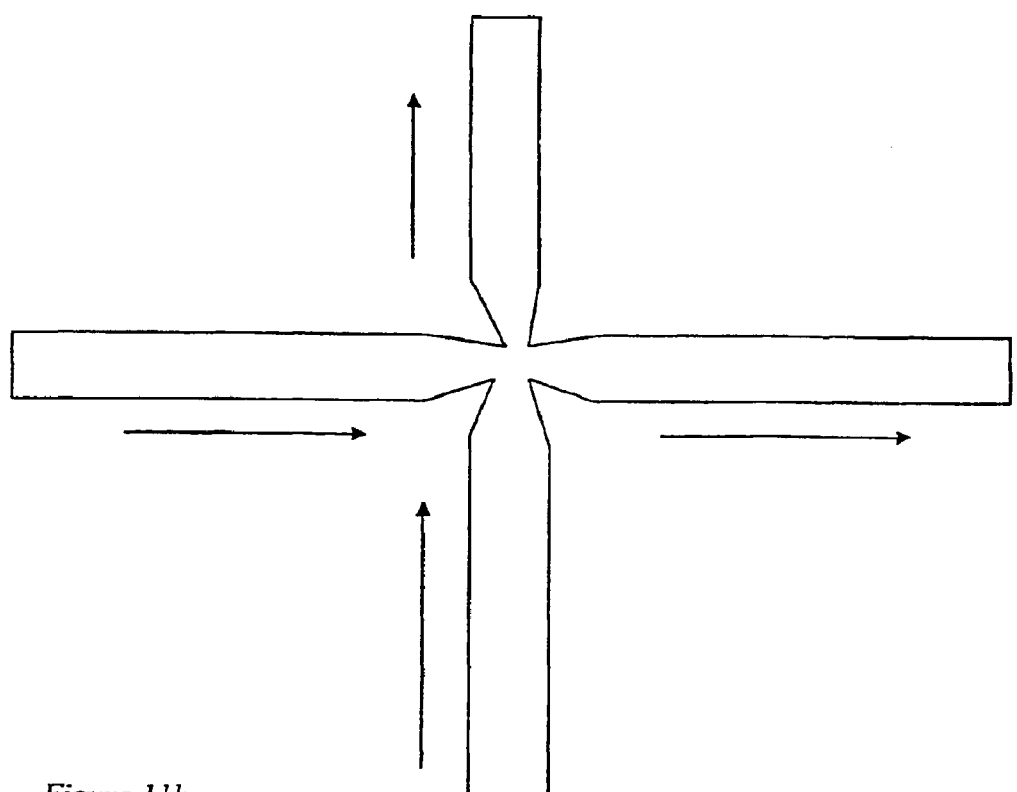

One of the major advantages of magnetic logic over conventional microelectronics is that signal lines can cross each other in the same plane. This greatly simplifies the design and fabrication of devices. FIG. 11 shows the dot thickness (FIG. 11a) or track width (FIG. 11b) variations required to do this. The thickness gradients in two of the four arms and the particular track width variations are selected to make the device unidirectional.

(v) Logic Gates

According to this invention as illustrated in the present examples there are two basic logic gates. The first is the AND/OR gate and the second is the NOT gate.

(a) AND/OR Gate

Figure 12A:
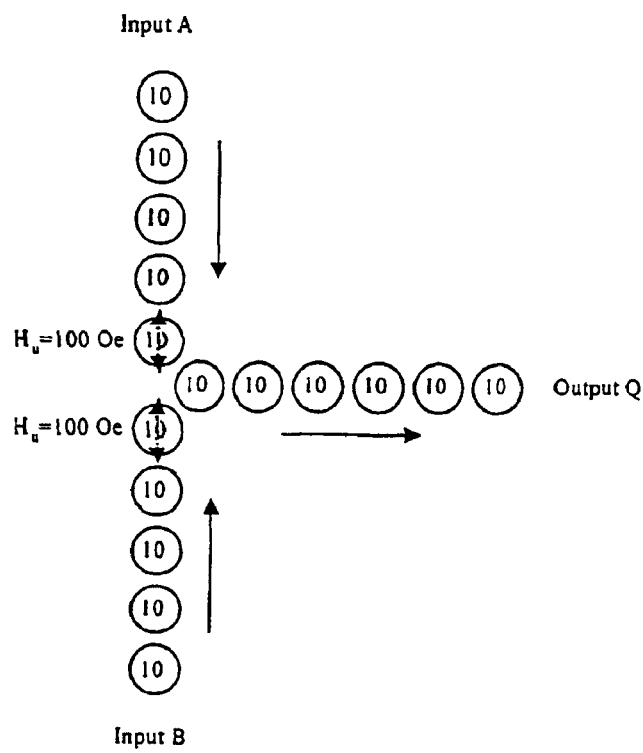
FIG. 12 shows an AND/OR gate architecture, arranged so that the gate will perform the AND function when the clock field sequence is as shown in FIG. 1.
Figure 12B:
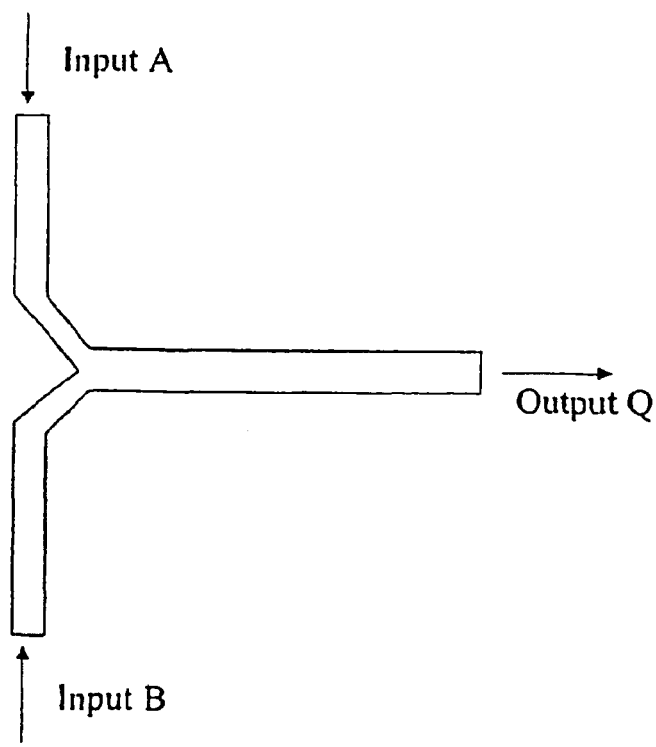

FIG. 12 shows the basic AND/OR gate. It has two inputs and one output. The coupling between the two input arms and the output arm is such that if the same logic state is presented on the two inputs, then that state will be transmitted to the output. If the inputs carry different logic states, however, then nothing is transmitted to the output and it retains its previous state. This alone does not constitute a useful logic function. The purpose of the strong pulse during phases 5 and 6 of the clock is to set the output of all logic gates to the same known state if, and only if, the two inputs are different. The gate then performs a useful logic function. For the clock sequence shown in FIG. 1, the output of the gate shown in FIG. 12 is logic 0 for all input states except both inputs=1. This is the AND function. Alternatively, if the strong clock pulse were oriented to the right, then the output of the gate would be logic 1 for all inputs states except both inputs =0, which is the OR function.

Figure 13A:
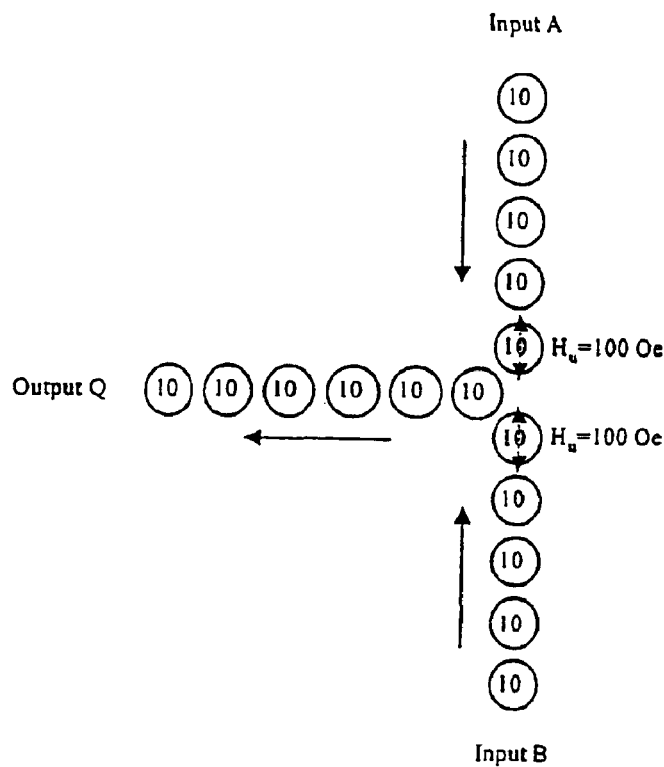
FIG. 13 shows the AND/OR gate of FIG. 12 arranged in the reverse direction so that the gate will perform the OR function when the clock field sequence is as shown in FIG. 1.
Figure 13B:
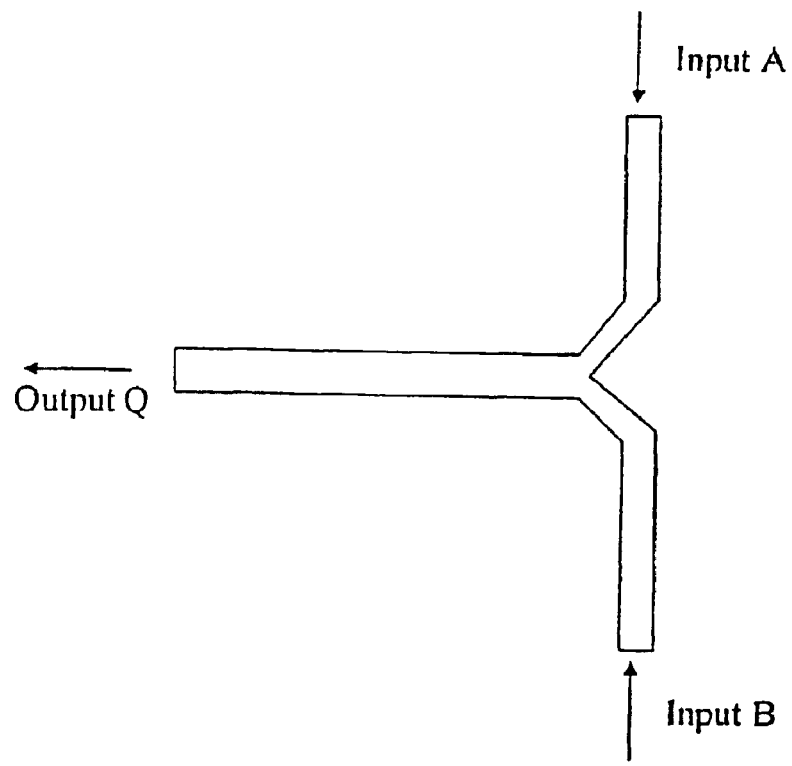
Figure 14A:
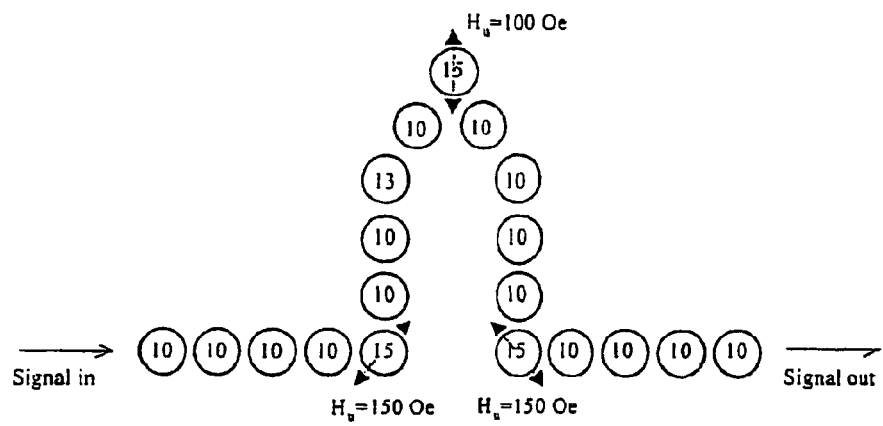
FIG. 14 shows a NOT gate architecture (upper) and a schematic representation of the magnetisation directions which lead to an inverted logic state.
Figure 14A:
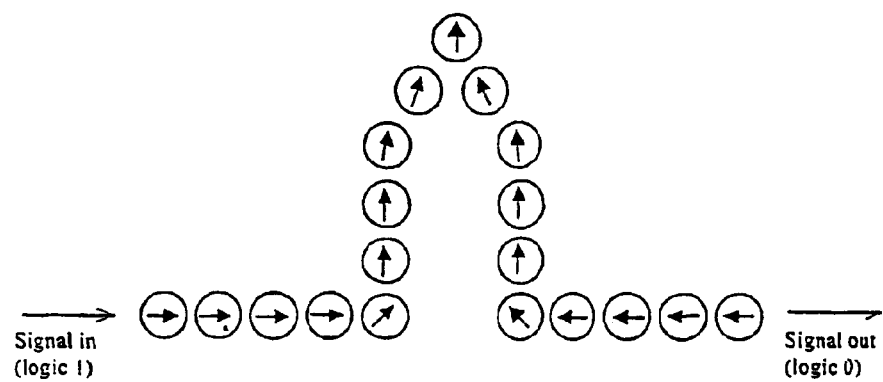
Figure 14B:
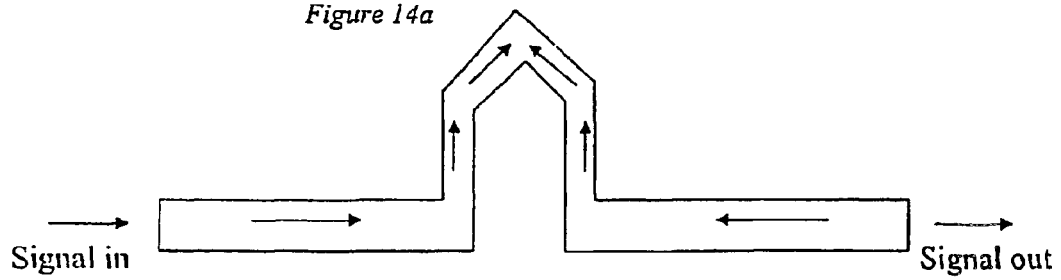
Figure 14B:
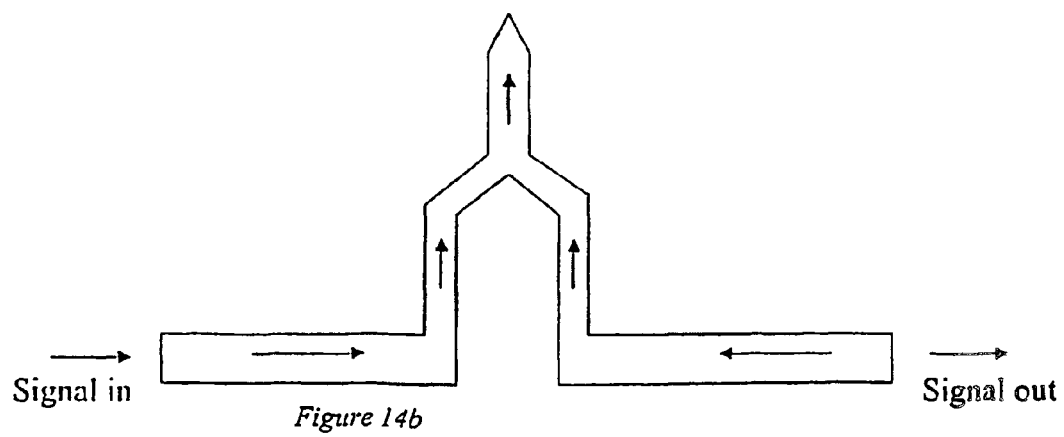

It is anticipated that the entire magnetic logic chip would experience the same phase 5/6 pulse, suggesting at first sight that only one type of gate can be obtained across a chip. However, this is not the case. If one reverses the direction of the AND/OR gate, as shown in FIG. 13, then it performs the opposite logic function, because the logic basis of the output arm has been reversed (assuming relative flow mapping of logic states—see section 0) but the phase 6 pulse direction has not. The ambiguous case where the two inputs are different is now reset to logic 1 (although still magnetisation pointing to the left), which generates the OR function. Thus, for the clock sequence of FIG. 1, FIG. 13 shows an OR gate.

(b) NOT Gate

FIG. 14 shows the basic inverting gate. The relatively tight angle at the top of the gate, combined with the uniaxial anisotropy in the top dot prevents the magnetisation from flowing around the loop, but rather creates a divergence. This is the source of the inverting function, as illustrated in the lower part of FIG. 14.

Figure 15A:
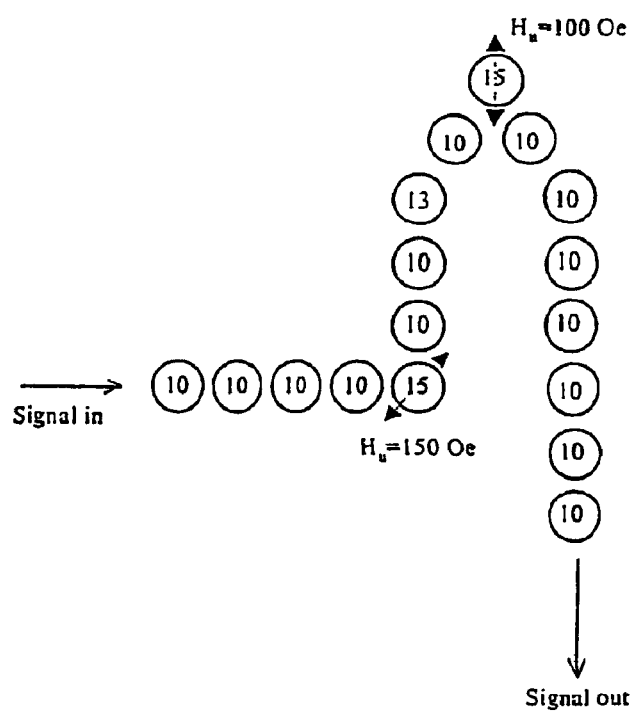
FIG. 15 shows a NOT gate which also turns a corner.
Figure 15B:
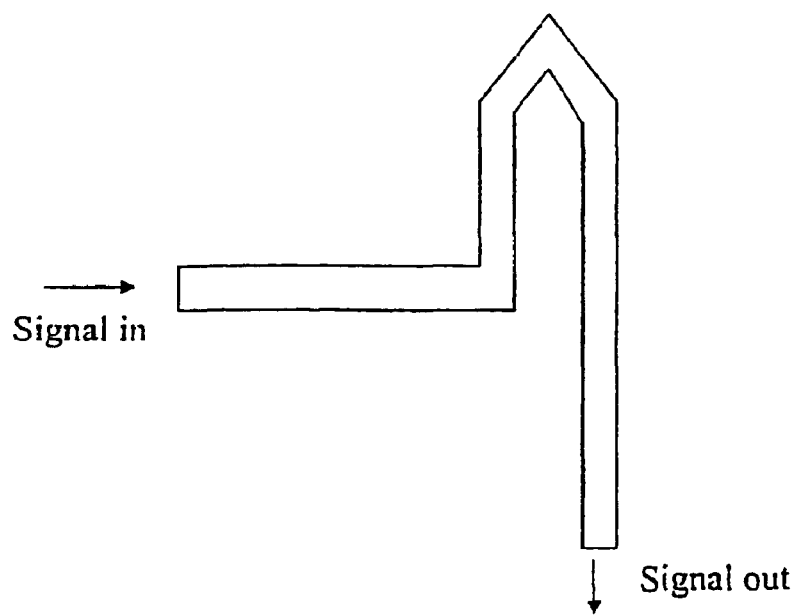

If it is desired to turn a corner at the same time as performing the inversion, FIG. 15 shows the same device without the second corner. Notice that because of the inverting nature of the gate, signals flow freely around corners of opposite sense to the clock field rotation sense.

(vi) Exchange Coupled Logic

The magnetic logic system based on nanodots presented as one example in this application and previously described in the Cowburn & Welland reference assumes magnetostatic coupling between magnetic dots. The present invention is not so restricted however, and in the alternative exploits an alternative magnetic logic scheme which uses exchange coupling between nanomagnetic elements.

Exchange coupling becomes dominant once the individual elements come into physical contact with each other. FIG. 16 shows some of the ways in which the elements may be coupled. In FIG. 16(*a*), a chain of abutting generally circular dots is shown; FIG. 16(*b*) shows connected hexagons; FIG. 16(*c*) shows the case where the individual nanomagnets have been smoothed to form a continuous strip of magnetic material. In this case, the information carrying soliton is actually a magnetic domain wall. According to this invention, the many of the architectural blocks described in this document may be used in either magnetostatic coupled or exchange coupled logic systems.

There are three principle advantages of using exchange coupled logic over magnetostatic coupling. Firstly, the exchange coupling energy density is independent of thickness, whereas the magnetostatic coupling energy density depends linearly on thickness. This means that in the case of exchange coupling, one can reduce the thickness to minimise spurious magnetostatic effects such as soliton pinning (a source of high propagation field) without reducing the coupling strength and hence the nucleation field. It should therefore be possible to obtain much larger field separation between the propagation and nucleation fields. Secondly, there are no small gaps to fabricate in exchange coupled devices, making the fabrication process simpler and cheaper. Thirdly, exchange coupled devices have a fourth parameter in addition to thickness, position and anisotropy which can be varied: width. This means that soliton energies can be gradually increased by a width taper (as shown in variuos of the possible embodiments illustrated in the figures) instead of a thickness gradient. Lateral variations are much easier to fabricate than thickness variations, again reducing the fabrication complexity and cost.

TABLE 1

| Block name | Clock phase | $H_p$ (Oe) | $H_n$ (Oe) | Comments |
| --- | --- | --- | --- | --- |
| Straight interconnect | 1 | 0 | | |
| Unidirectional interconnect | | | | |
| Terminated line | 1 | 1 | 100 | |
| Symmetric corner | 1 | 17 | 76 | |
| | 2 | 6 | 80 | |
| Asymmetric corner | 1 | 16 | 94 | |
| | 2 | 7 | 81 | |
| 2-phase fan out | 1 | 19 | 104 | |
| | 2 | 3 | 73 | |
| | 4 | 18 | 73 | |
| 1-phase fan out | 1 | 22 | 77 | |
| Cross road | 1, 2 | 17 | 82 | |
| AND/OR gate | 1 | 0 | 98 | Inputs equal |
| | 1 | | 45 | Inputs different |
| | 2 | <0 | 57 | |
| | 4 | | 100 | |
| NOT gate | 1 | 15 | | |
| | 2 | 25 | 67 | |
| | 3 | 7 | 74 | |

$H_p$ = soliton propagation field, $H_n$ = soliton nucleation field.

The values in the table were calculated assuming a nominal dot diameter of 100 nm, thickness of 10 nm and centre-to-centre spacing of 135 nm. A temperature of 300K was assumed and saturation magnetisation of 800 emu cm$^{-3}$, as would be appropriate for Permalloy ($Ni_{80}Fe_{20}$).

What is claimed is:

1. A magnetic logic element for a logic device comprising at least one conduit capable of sustaining and propagating a magnetic soliton, wherein the conduit is further adapted by the provision of nodes and/or directional changes giving rise to discontinuities in soliton propagation energy as a result of which logical functions are processed.

2. The magnetic logic element of claim 1, wherein the conduit is so configured that a soliton nucleation field is at least twice a soliton propagation field.

3. The magnetic logic element of claim 2, wherein the soliton nucleation field is at least three times the soliton propagation field.

4. The magnetic logic device of claim 1, wherein the conduit is so configured that a soliton nucleation field does not exceed ten times a soliton propagation field.

5. The magnetic logic element of claim 4, wherein the soliton nucleation field is between four and six times the soliton propagation field.

6. The magnetic logic element of claim 1, wherein the magnetic conduit is formed as a continuous track of magnetic material.

7. The magnetic logic element of claim 1, wherein the magnetic conduit comprises discrete areas of magnetic material, spaced in an array at a distance that is sufficiently small to ensure magnetic coupling between adjacent areas.

8. The magnetic logic element of claim 1, wherein the magnetic conduit is formed as a continuous track of magnetic material and wherein the track has a width of less than 200 nm.

9. The magnetic logic element of claim 8, wherein the track has a width of less than 100 nm.

10. The magnetic logic element of claim 9, wherein the track has a thickness of between 5 and 20 nm.

11. The magnetic logic element of claim 10, wherein the track has a thickness of between 5 and 10 nm.

12. The magnetic logic element of claim 1, wherein the conduit is formed from a soft magnetic material selected from permalloy (Ni80Fe20) or CoFe.

13. The magnetic logic element of claim 1, wherein the conduit comprises magnetic material formed on a non-magnetic substrate.

14. The magnetic logic element of claim 1, wherein the conduit includes at least one discontinuity in propagation energy therealong, at a direction change or node, and a transition zone is provided in advance of the discontinuity in a propagation direction, wherein magnetic properties in the transition zone are adapted to provide a gradual propagation energy transition to the discontinuity.

15. The magnetic logic element of claim 14, wherein the transition zone employs separately or in combination variations in thickness of magnetic material of the conduit, variations in width of the conduit, and in the case where the conduit comprises discrete magnetic area, variations in spacing and size of the discrete magnetic areas.

16. The magnetic logic element of claim 15, wherein the conduit is configured such that variation in soliton propagation energy between adjacent regions of the conduit is of the order of 5 to 20% in the transition zone.

17. The magnetic logic element of claim 14, wherein the conduit is configured such that variation in soliton propagation energy between adjacent regions of the conduit is of the order of 5 to 20% in the transition zone.

18. The magnetic logic element of claim 1, including one or more discrete magnetic regions having isotropic magnetic properties in the propagation plane.

19. The magnetic logic circuit of claim 1, further comprising a plurality of magnetic logic interconnects, the plurality of magnetic logic interconnects comprising at least one magnetic logic element.

20. The magnetic logic circuit of claim 19, further comprising means for providing a controlled driving magnetic field.

21. The magnetic logic circuit of claim 20, wherein the controlled driving magnetic field consists of two orthogonal fields operating in a pre-determined sequence as a clocking field in a clockwise or anticlockwise direction.

22. The magnetic logic circuit of claim 1, further comprising a plurality of magnetic logic gates, the plurality of magnetic logic gates comprising at least one magnetic logic element.

23. The magnetic logic circuit of claim 22, further comprising means for providing a controlled driving magnetic field.

24. The magnetic logic circuit of claim 23, wherein the controlled driving magnetic field consists of two orthogonal fields operating in a pre-determined sequence as a clocking field in a clockwise or anticlockwise direction.

25. A magnetic logic interconnect for a magnetic logic circuit having at least one magnetic logic element, the magnetic logic element comprising at least one conduit capable of sustaining and propagating a magnetic soliton, wherein the conduit is further adapted by the provision of nodes and/or directional changes giving rise to discontinuities in soliton propagation energy as a result of which logical functions are processed.

26. A magnetic logic gate for a magnetic logic circuit having at least one magnetic logic element, the magnetic logic element comprising at least one conduit capable of sustaining and propagating a magnetic soliton, wherein the conduit is further adapted by the provision of nodes and/or directional changes giving rise to discontinuities in soliton propagation energy as a result of which logical functions are processed.

* * * * *